United States Patent [19]
Rostoker et al.

[11] Patent Number: 5,650,653
[45] Date of Patent: Jul. 22, 1997

[54] MICROELECTRONIC INTEGRATED CIRCUIT INCLUDING TRIANGULAR CMOS "NAND" GATE DEVICE

[75] Inventors: Michael D. Rostoker, Boulder Creek; James S. Koford, Mountain View; Ranko Scepanovic, San Jose; Edwin R. Jones; Gobi R. Padmanahben, both of Sunnyvale; Ashok K. Kapoor, Palo Alto, all of Calif.; Valeriy B. Kudryavtsev, Moscow, Russian Federation; Alexander E. Andreev, Moskovskata Oblast, Russian Federation; Stanislav V. Aleshin, Moscow, Russian Federation; Alexander S. Podkolzin, Moscow, Russian Federation

[73] Assignee: LSI Logic Corporation, Milpitas, Calif.

[21] Appl. No.: 561,107

[22] Filed: Nov. 21, 1995

Related U.S. Application Data

[63] Continuation of Ser. No. 438,614, May 10, 1995, abandoned.
[51] Int. Cl.[6] .............. H01L 29/76; H01L 27/10; H01L 31/062; H01L 31/113
[52] U.S. Cl. .............. 257/369; 257/206; 257/208
[58] Field of Search .............. 257/369, 341, 257/371, 401, 206, 210, 408, 208, 351; 326/38

[56] References Cited

U.S. PATENT DOCUMENTS

| | | | |
|---|---|---|---|
| 4,626,880 | 12/1986 | Minh et al. | 257/341 |
| 5,187,552 | 2/1993 | Hendrickson et al. | 257/408 |
| 5,406,104 | 4/1995 | Hirota et al. | 257/351 |
| 5,442,246 | 8/1995 | Azegami et al. | 326/38 |

*Primary Examiner*—Sara W. Crane
*Assistant Examiner*—Adriana Giordana
*Attorney, Agent, or Firm*—Steven W. Smyrski; Poms, Smith, Lande & Rose

[57] ABSTRACT

A microelectronic integrated circuit includes a semiconductor substrate, and a plurality of CMOS microelectronic devices formed on the substrate. Each device includes a triangular ANY element of a first conductivity type (PMOS or NMOS), and a triangular ALL element of a second conductivity type (NMOS or PMOS), the ANY and ALL elements each having a plurality of inputs and an output that are electrically interconnected respectively. The ANY element is basically an OR element, and the ALL element is basically an AND element. However, the power supply connections and the selection of conductivity type (NMOS or PMOS) for the ANY and ALL elements can be varied to provide the device as having a desired NAND, AND, NOR or OR configuration, in which the ANY element acts as a pull-up and the ALL element acts as a pull-down, or vice-versa.

47 Claims, 12 Drawing Sheets

FIG. 12
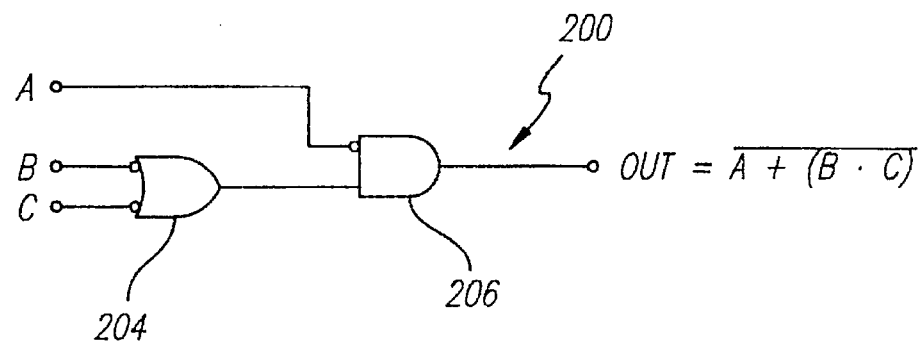
$OUT = \overline{A + (B \cdot C)}$
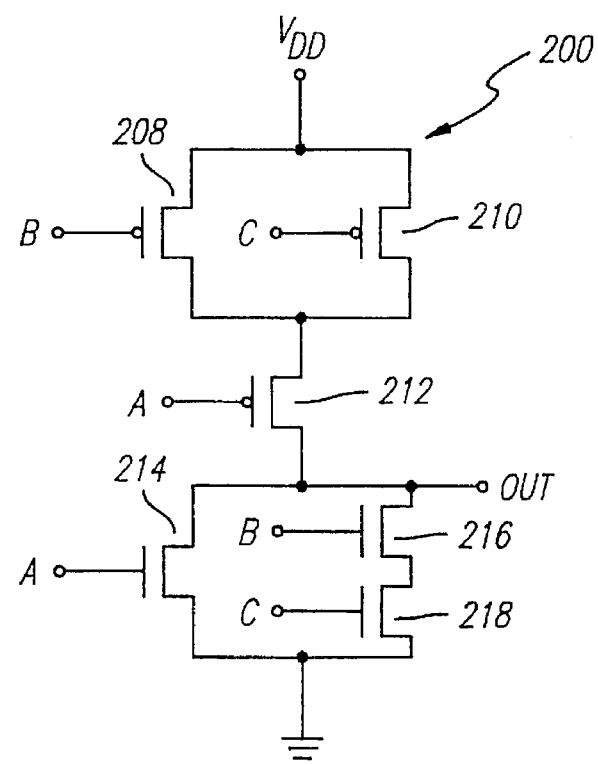
FIG. 13

5,650,653

1

MICROELECTRONIC INTEGRATED CIRCUIT INCLUDING TRIANGULAR CMOS "NAND" GATE DEVICE

CROSS REFERENCE TO RELATED APPLICATION

This application is a continuation of U.S. patent application Ser. No. 08/438,614, filed May 10, 1995, abandoned.

BACKGROUND OF THE INVENTION

1. Field of the Invention

The present invention generally relates to the art of microelectronic integrated circuits, and more specifically to a microelectronic integrated circuit including a plurality of triangular CMOS "NAND" gate devices.

DESCRIPTION OF THE RELATED ART

Microelectronic integrated circuits consist of large numbers of semiconductor devices that are fabricated by layering several different materials on a silicon base or wafer. These devices include logic gates that provide AND, OR, NAND, NOR and other binary logic functions. Each device includes a plurality of pins or terminals that are connected to pins of other devices by electrical interconnect wire networks or nets.

As illustrated in FIG. 1, a conventional microelectronic integrated circuit 10 comprises a substrate 12 on which a large number of semiconductor devices are formed. These devices include large functional macroblocks such as indicated at 14 which may be central processing units, input-output devices or the like. A typical integrated circuit further comprises a large number of smaller devices such as logic gates 16 which are arranged in a generally rectangular pattern in the areas of the substrate 12 that are not occupied by macroblocks.

The logic gates 16 have terminals 18 to provide interconnections to other gates 16 on the substrate 12. Interconnections are made via vertical electrical conductors 20 and horizontal electrical conductors 22 that extend between the terminals 18 of the gates 16 in such a manner as to achieve the interconnections required by the netlist of the integrated circuit 10. It will be noted that only a few of the elements 16, 18, 20 and 22 are designated by reference numerals for clarity of illustration.

In conventional integrated circuit design, the electrical conductors 20 and 22 are formed in vertical and horizontal routing channels (not designated) in a rectilinear (Manhattan) pattern. Thus, only two directions for interconnect routing are provided, although several layers of conductors extending in the two orthogonal directions may be provided to increase the space available for routing.

A goal of routing is to minimize the total wirelength of the interconnects, and also to minimize routing congestion. Achievement of this goal is restricted using conventional rectilinear routing because diagonal connections are not possible. A diagonal path between two terminals is shorter than two rectilinear orthogonal paths that would be required to accomplish the same connection.

Another drawback of conventional rectilinear interconnect routing is its sensitivity to parasitic capacitance. Since many conductors run in the same direction in parallel with each other, adjacent conductors form parasitic capacitances that can create signal crosstalk and other undesirable effects.

SUMMARY OF THE INVENTION

In accordance with the present invention, electrical conductors for interconnecting terminals of microelectronic

2 devices of an integrated circuit extend in three directions that are angularly displaced from each other by 60°.

The conductors pass through points defined by centers of closely packed small hexagons superimposed on the substrate such that the conductors extend perpendicular to edges of the hexagons.

The conductors that extend in the three directions can be formed in three different layers, or alternatively the conductors that extend in two or three of the directions can be formed in a single layer as long as they do not cross.

A microelectronic integrated circuit that utilizes the present three direction routing arrangement includes a semiconductor substrate, and a plurality of microelectronic devices that are formed on the substrate in a closely packed triangular arrangement that maximizes the space utilization of the circuit.

The present integrated circuit includes a semiconductor substrate, and a plurality of CMOS microelectronic devices formed on the substrate. Each device includes a triangular ANY element of a first conductivity type (PMOS or NMOS), and a triangular ALL element of a second conductivity type (NMOS or PMOS), the ANY and ALL elements each having a plurality of inputs and an output that are electrically interconnected respectively.

The ANY element is basically an OR element, and the ALL element is basically an AND element. However, the power supply connections and the selection of conductivity type (NMOS or PMOS) for the ANY and ALL elements can be varied to provide the device as having a desired NAND, AND, NOR or OR configuration, in which the ANY element acts as a pull-up and the ALL element acts as a pull-down, or vice-versa.

The present invention substantially reduces the total wirelength interconnect congestion of the integrated circuit by providing three routing directions, rather than two as in the prior art. The routing directions include, relative to a first direction, two diagonal directions that provide shorter interconnect paths than conventional rectilinear routing.

In addition, the number of conductors that extend parallel to each other is smaller, and the angles between conductors in different layers are larger than in the prior art, thereby reducing parasitic capacitance and other undesirable effects that result from conventional rectilinear routing.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 12 is a functional circuit diagram of the gate device of FIG. 11; and

FIG. 13 is a schematic diagram illustrating the gate device of FIG. 11 as being represented by field-effect transistors.

DETAILED DESCRIPTION OF THE INVENTION

Figure 1:
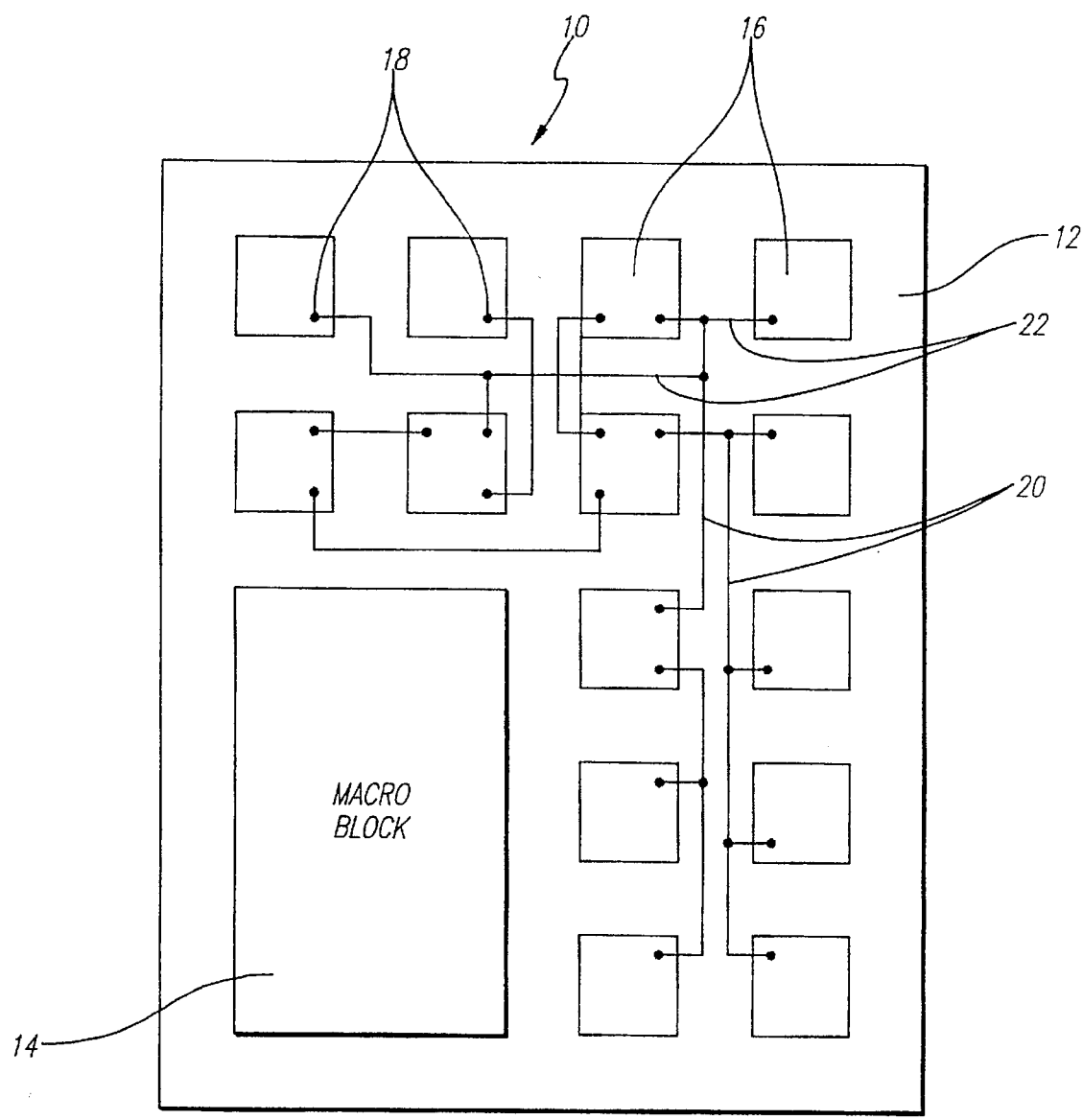
FIG. 1 is a diagram illustrating a prior art integrated circuit.
Figure 2:
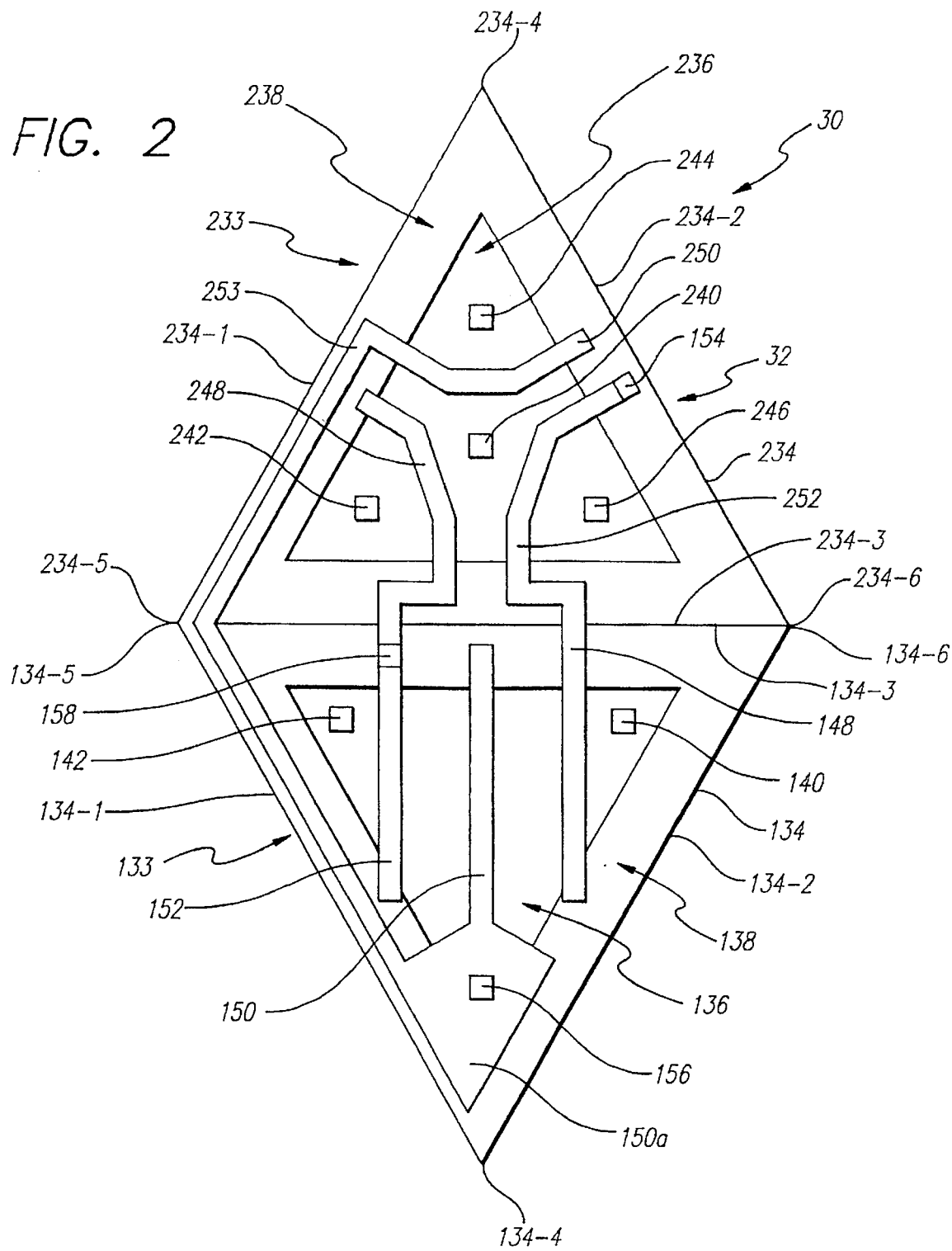
FIG. 2 is a diagram illustrating a microelectronic gate device embodying the present invention.

A semiconductor CMOS gate device for a microelectronic integrated circuit is designated by the reference numeral 30 and illustrated in FIG. 2. The device 30, in its basic form, provides a logical NAND function, but can be adapted to provide a logical AND, NOR, OR or other logical function as will be described below.

The gate device 30 is formed on a substrate 32, and includes a logical "ALL" element 133 having a triangular periphery 134 including first to third edges 134–1, 134–2 and 134–3, and first to third vertices 134–4, 135–6 and 135–7 respectively in the illustrated arrangement. A triangular semiconductor active area 136 is formed within the periphery 134, and an inactive area 138 is defined between the active area 136 and the periphery 134.

The ALL element 133 comprises an electrically conductive electrode or terminal 140 which is formed in the active area 136 adjacent to the vertex 134–6 and functions as a Field-Effect-Transistor (FET) source terminal. Another electrode or terminal 142 is formed in the active area 136 adjacent to the vertex 134–5 and functions as an FET drain terminal.

The ALL element 133 further comprises gates 148, 150 and 152 that are formed between the terminals 140 and 142. The gates 148, 150 and 152 are preferably insulated gates, each including a layer of insulating oxide withe layer of conductive metal formed over the oxide in a Metal-Oxide-Semiconductor (MOS) configuration.

In order to provide effective source-drain electrical isolation, the opposite end portions of each of the gates 148, 150 and 152 extend into the inactive area 138. The lower end of the gate 150 has the shape of a solid quadrilateral which extends into the inactive area 138 as indicated at 150a. This is for the purpose of avoiding manufacturing problems which could result if the lower end of the gate 150 extended through the lower vertex of the triangular active area 136. Other layout schemes could be used to achieve this purpose of making the design immune to manufacturing tolerances.

The ALL element 133 in its most basic form provides a logical AND function. The terminal 140 functions as a source terminal, whereas the terminal 142 functions as a drain terminal of a field effect transistor, with a channel being defined between the terminals 140 and 142.

Each gate 148, 150 and 152 controls the electrical conductivity of a respective underlying portion of the channel such that each gate 148, 150 and 152 can independently inhibit conduction through the channel. Signals must be applied to all of the gates 148, 150 and 152 which cause the underlying portions of the channel to become enhanced in order to enable conduction through the channel. This is an "ALL" or "AND" configuration.

The device 30 further includes an "ANY" element 233 having a triangular periphery 234 including first to third edges 234–1, 234–2 and 234–3, first to third vertices 234–4, 234–5 and 234–6 respectively in the illustrated arrangement, and an active area 236. An inactive area 238 is defined between the active area 236 and the periphery 234.

The ANY element 233 comprises a central electrically conductive electrode or terminal 240 which functions as a source terminal, and electrodes or terminals 242, 244 and 246 which are formed in the active area 236 adjacent to the vertices 234–5, 234–234–4 and 234–6 respectively.

The terminals 242, 244 and 246 function as FET drain terminals, and are preferably interconnected for operation. Although one each of the terminals 242, 244 and 246 are illustrated in the drawing, it is within the scope of the invention to provide two or more of each of the terminals 242, 244 and 246.

The ANY element 233 further comprises gates 248, 250 and 252 that are formed between the terminals 242, 244 and 246 respectively and the central terminal 240. The gates 248, 250 and 252 are preferably insulated gates, each including a layer of insulating oxide with a layer of conductive metal formed over the oxide in a MOS configuration.

In order to provide effective source-drain electrical isolation, the opposite end portions of each of the gates 248, 250 and 252 extend into the inactive area 238.

The ANY element 233 in its most basic form provides a logical OR function. Each drain terminal 242, 244 and 246 and respective gate 248, 250 and 252 forms a field effect transistor in combination with the common source terminal 240 such that each transistor can independently establish a conduction channel between its drain and the source. This is an "ANY" or "OR" configuration.

The device 30 has a CMOS configuration, with one of the elements 133,233 having a first conductivity type, and the other of the elements 133,233 having a second conductivity type which is opposite to the first conductivity type.

More specifically, one of the elements 133,233 will be N-channel (NMOS), and the other of the elements 133,233 will be P-channel (PMOS). One of the elements 133,233 will act as a pull-up element for the output of the device 30, whereas the other of the elements 133,233 will act as a pull-down element.

In order to minimize the area required on the substrate 32 by the device 30, the elements 133,233 are preferably closely packed, with the peripheries 134 and 234 having a common edge. As illustrated, the edge 134–3 of the element 133 is common with the edge 234–3 of the element 233 such that the device has a quadrilateral or "diamond" shape.

The gates 152,248 and 148,252 are integrally formed, and extend across the inactive areas 138 and 238. An electrical conductor 253 extends through the inactive areas 138 and 238 adjacent to the edges 134–1 and 234–1 of the elements 133 and 233 respectively, and connects the gate 150 to the gate 250. The gates 248, 250 and 252 of the ANY element 233 are thereby electrically connected to the gates 152, 150 and 148 of the ALL element 133 respectively.

A gate terminal 154 which constitutes a common input terminal the gates 148 and 252 is formed in the inactive area 238 of the ALL element 233 adjacent to the edge 234–2. A gate terminal 156 which constitutes a common input terminal for the gates 150 and 250 is formed in the inactive area 138 of the ALL element adjacent to the vertex 134–4. A gate terminal 158 which constitutes a common input terminal for the gates 152 and 248 is formed in the inactive area 138 adjacent to the edge 134-3.

It will be noted that the locations of the gate terminals 154, 156 and 158 are exemplary, and that the gate terminals can be located at different points in the device in accordance with the requirements of a particular design or application.

The inputs of the ALL element 133 and the ANY element 233 are thereby respectively interconnected. As will be described below, the outputs of the ALL element 133 and the ANY element 233 are also interconnected to provide a desired functionality.

Figure 3:
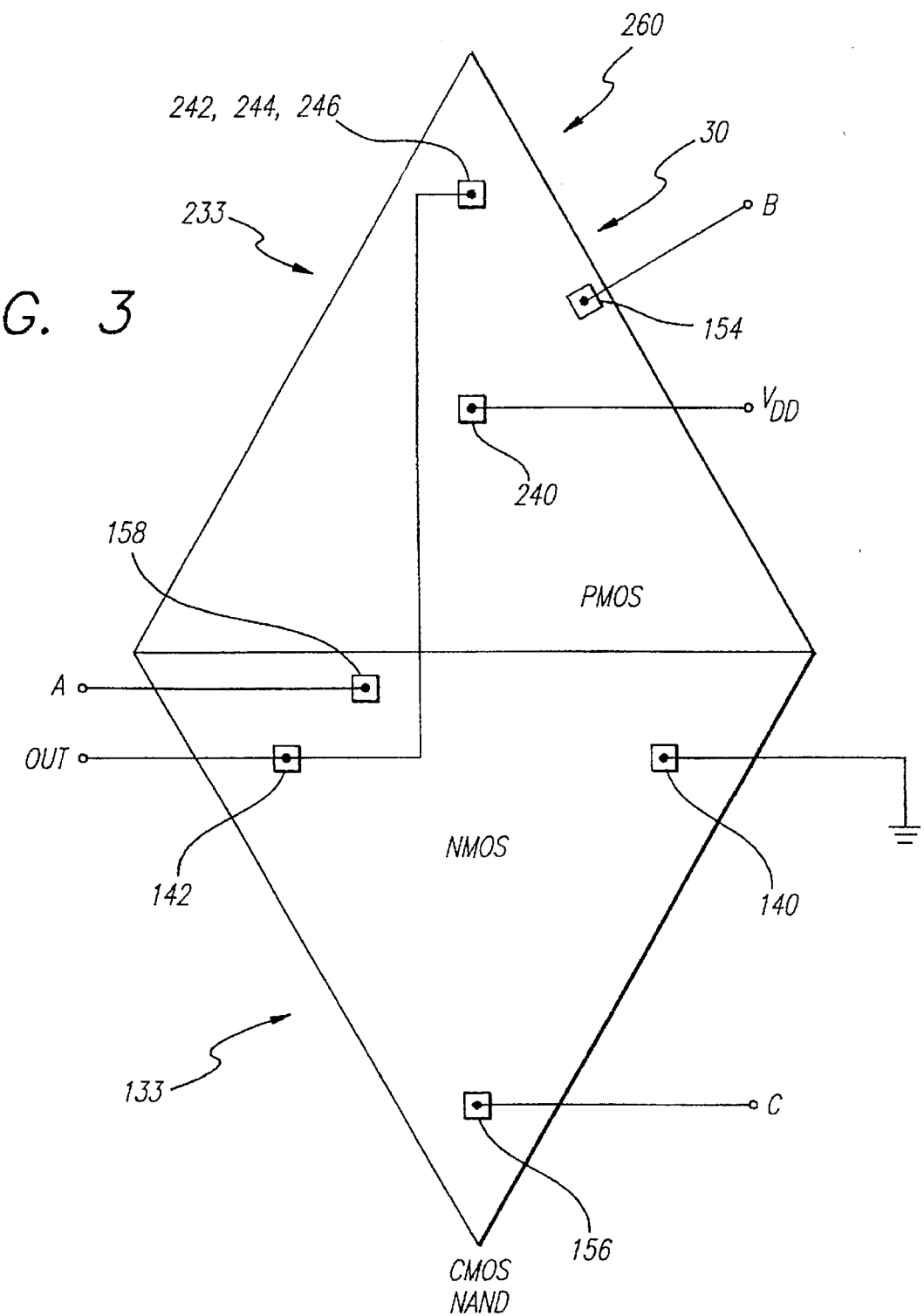
FIG. 3 is an electrical schematic diagram illustrating the present device connected to provide a logical NAND function.

A CMOS NAND gate 260 based on the device 30 is illustrated in FIG. 3. The device 30 is shown in simplified form for clarity of illustration, with only the triangular peripheries of the elements 133 and 233 and their terminals included in the drawing. The terminals 242 and 246 are not explicitly illustrated, and are assumed to be electrically connected to the terminal 244.

Input signals A, B and C are applied to the gate terminals 158, 154 and 156 respectively. A logically high signal or potential will be assumed to be substantially equal to $V_{DD}$, and a logically low signal will be assumed to be substantially equal to ground, with $V_{DD}$ being more positive than ground.

The active area 236 of the ANY element 233 is N-type to provide PMOS operation. The central terminal 240 is connected to $V_{DD}$, whereas an output signal OUT is taken at the interconnected drain terminals 242, 244 and 246.

Any low input will establish a conductive channel between the terminals 242, 244 and 246 and the central terminal 240, thereby connecting the output to $V_{DD}$ and producing a high output signal OUT. When all of the inputs are high, the ANY element 233 is turned off and the terminals 242, 244 and 246 float.

The ANY element 233 thereby functions as a pull-up element of the CMOS NAND gate 260, in which any low input produces a high output.

The active area 136 of the ALL element 133 is P-type to provide NMOS operation. The source terminal 140 is connected to ground, and the drain terminal 142 is connected to the terminals 242, 244 and 246 of the ANY element 233 to provide a common output.

When any of the inputs are low, the ALL element 133 is turned off and the terminal 142 will float. If all of the inputs are high, a conductive channel will be established between the terminals 140 and 142 to connect the output to ground and produce a logically low output.

The ANY element 133 therefore functions as a pull-down element of the CMOS NAND gate 260, such that any low input produces a high output, and the output is low in response to all inputs being high.

Figure 4:
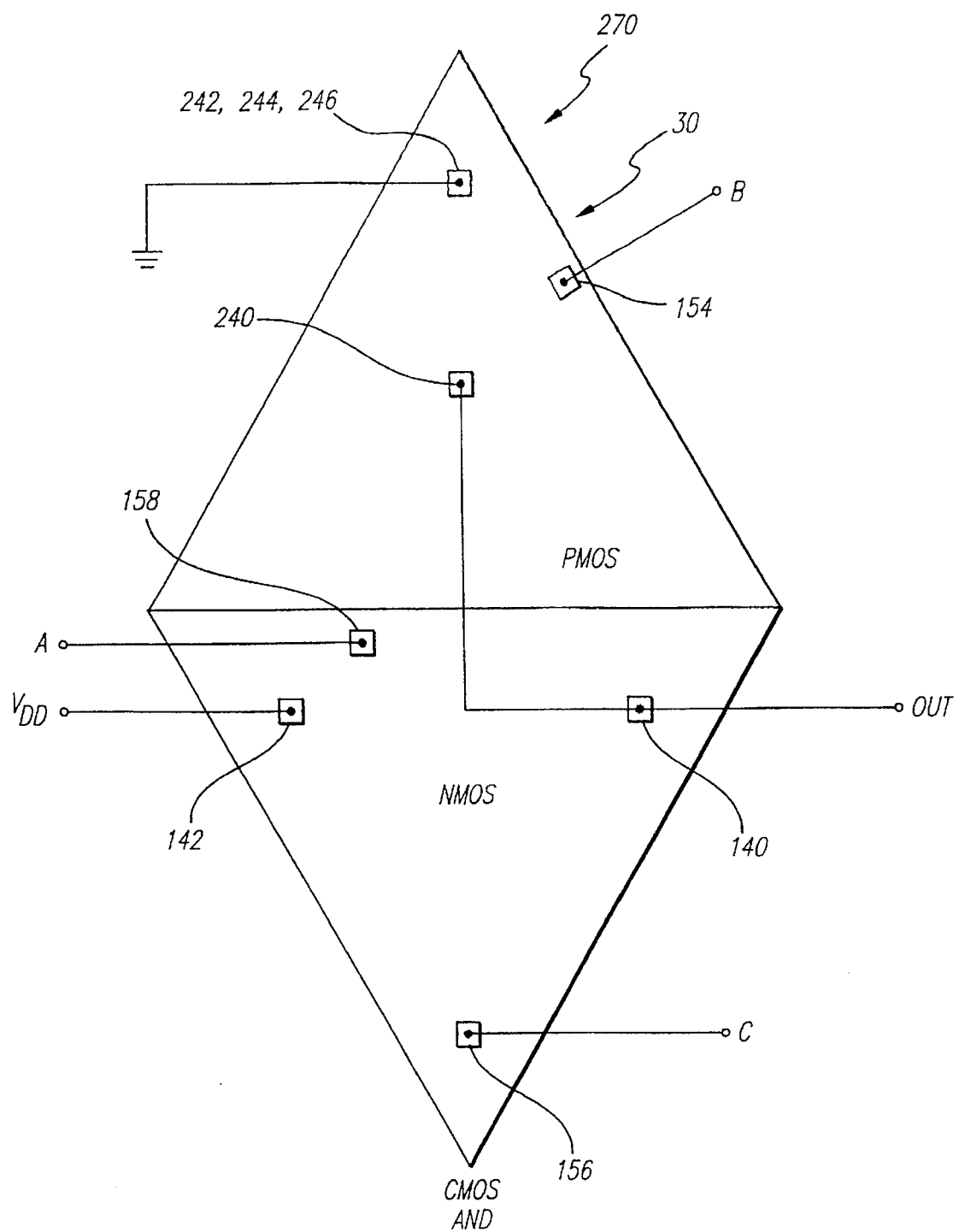
FIG. 4 is an electrical schematic diagram illustrating the gate device connected to provide a logical AND function.

A CMOS AND gate 270 incorporating the device 30 is illustrated in FIG. 4. The active area 236 of the ANY element 233 is N-type to provide PMOS FET operation, and the terminals 242, 244 and 246 are connected to ground. The output signal OUT appears at the central terminal 240.

Due to the PMOS configuration of the ANY element 233 in the AND gate 270, a logically low input signal A, B or C will establish a conductive channel between the terminals 242, 244 and 246 respectively and the central terminal 240. This connects the output to ground. When all of the inputs are high, the ANY element 233 is turned off, and the terminal 240 floats.

Thus, any low input will produce a low output, and the ANY element 233 acts as a pull-down element of the CMOS AND gate 270.

The active area 136 of the ALL element 133 is P-type to provide NMOS FET operation. The drain terminal 142 is connected to $V_{DD}$, and the terminal 140 is connected to the terminal 240 of the ANY element 233 to provide a common output OUT.

With any logically low input signal A, B and C applied to the gate terminal 154, 156 or 158 respectively, the ALL element 133 will be turned off and the terminal 140 will float.

Since the ALL element 133 provides NMOS operation in the configuration of FIG. 4, positive inputs to all of the gate terminals 154, 156 and 158 will establish a conductive channel between the terminals 140 and 242. The entire channel will be enhanced, thereby connecting the source terminal 140 to the potential $V_{DD}$ through the drain terminal 142 to produce a logically high output.

In this manner, the ALL element 133 acts as a pull-up element of the AND gate 270, such that the gate 270 produces a logically high output when all of the inputs are high, and a logically low output when any of the inputs are low.

Figure 5:
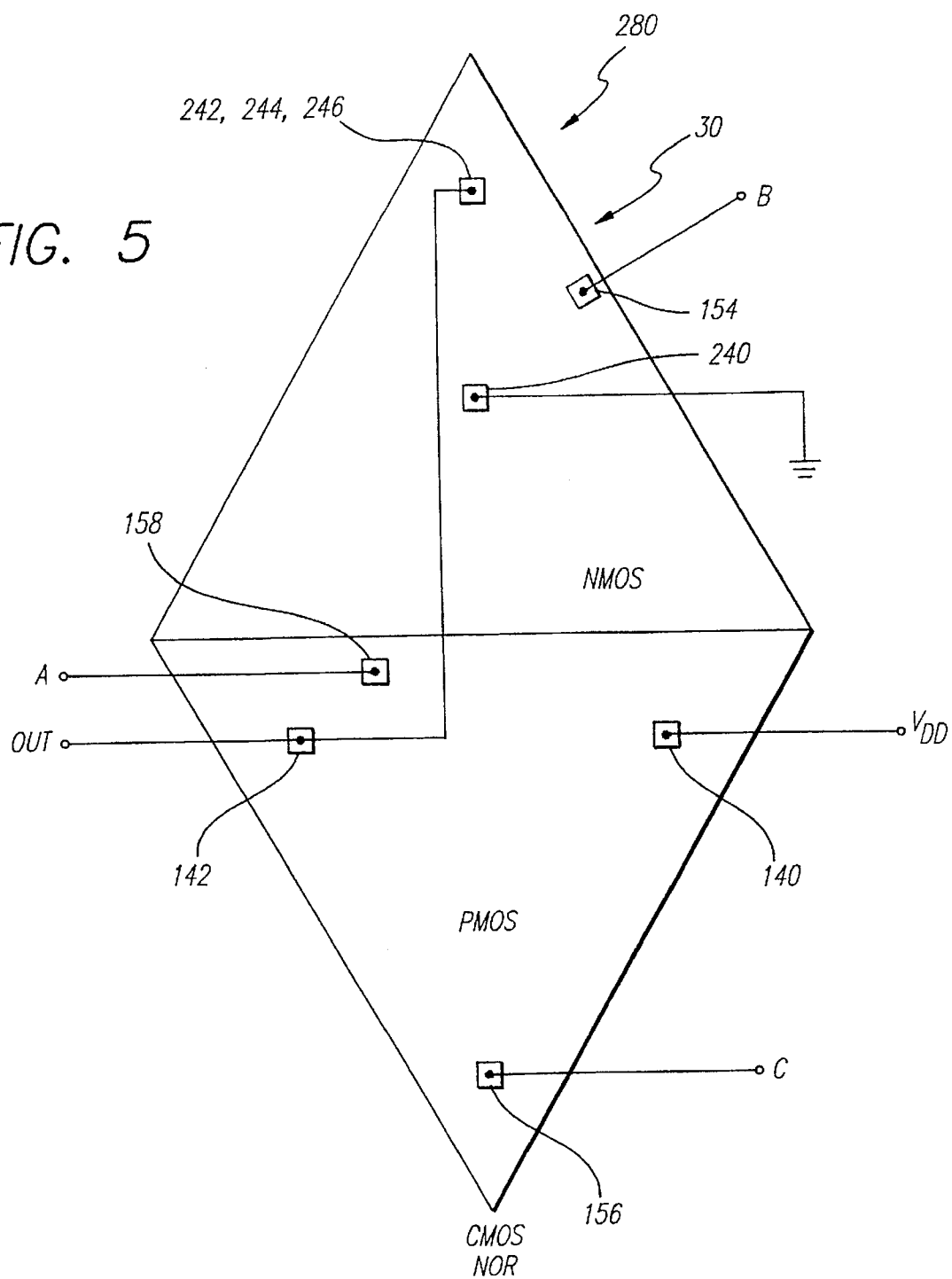
FIG. 5 is an electrical schematic diagram illustrating the gate device connected to provide a logical NOR function.

A NOR gate 280 incorporating the device 30 is illustrated in FIG. 5, in which the active area 236 of the ANY element 233 is P-type to provide NMOS operation. The central terminal 240 is connected to ground, and the terminals 242, 244 and 246 are connected to provide an output.

When all of the inputs are low, the ANY element 233 is turned off and the terminals 242, 244 and 246 will float. If any of the inputs is high, a conductive channel will be established between the respective terminals 242, 244 and 246 and the central terminal 240 to connect the terminals 242, 244 and 246 and thereby the output to ground to produce a logically low output.

In this manner, the ANY element 233 acts as a pull-down element of the CMOS NOR gate 280, with the output OUT being low if any or all inputs are high.

The active area 136 of the ALL element 133 is N-type to provide PMOS operation. The source terminal 140 is connected to $V_{DD}$, whereas the drain terminal 142 is connected to the output OUT.

All low inputs will establish a conductive channel between the terminals 140 and 142, thereby connecting the output to $V_{DD}$ and producing a high output. When any of the inputs are high, the ALL element 133 is turned off and the terminal 142 floats.

Thus, the NOR configuration is provided, in which the ALL element 133 acts as a pull-up element, any high input produces a low output, and the output is high in response to all inputs being low.

Figure 6:
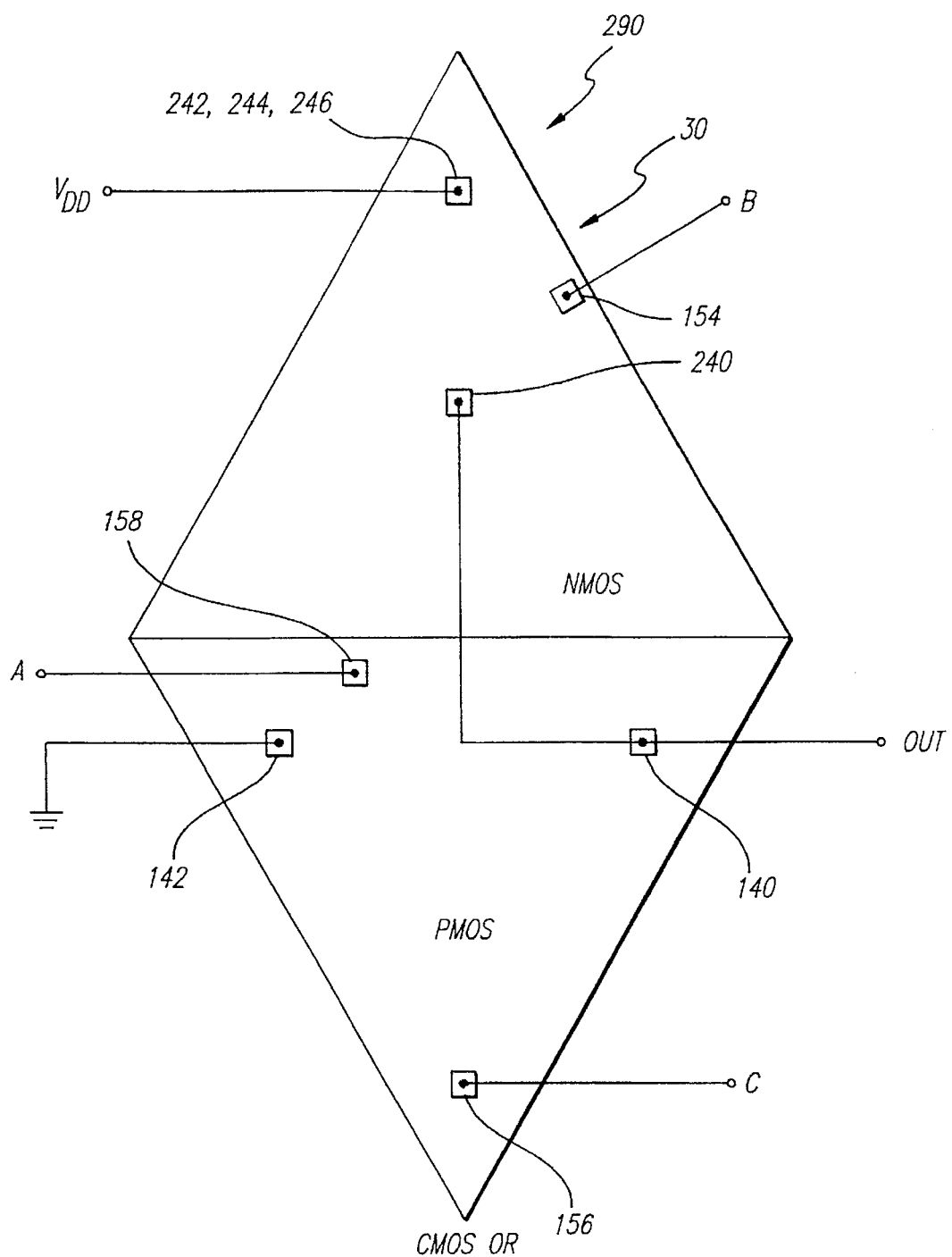
FIG. 6 is an electrical schematic diagram illustrating the gate device connected to provide a logical OR function.

A CMOS OR gate 290 based on the device 30 is illustrated in FIG. 6. The active area 236 of the ANY element 233 is P-type to provide NMOS FET operation. The terminals 242, 244 and 246 are connected to $V_{DD}$, whereas the terminal 40 is connected to provide an output.

With all logically low input signals applied to the gate terminals 254, 256 and 258 respectively, the ANY element 233 will be turned off and the terminals 242, 244 and 266 will float.

Since the device 30 provides NMOS operation in the configuration of FIG. 6, a positive input to any of the gate terminals 254, 256 and 258 will establish a conductive channel between the terminals 242, 244 and 246 respectively and the central terminal 240. Any one of these channels will connect the central terminal 240 to the potential $V_{DD}$ to produce a logically high output.

In this manner, the ANY element 233 acts as a pull-up element of the OR gate 290, and the output OUT is logically high when any or all of the inputs is high.

The active area 136 of the ANY element 133 is N-type to provide PMOS FET operation. The drain terminal 142 is connected to ground, and the source terminal 140 is connected to provide an output.

Due to the PMOS configuration of the ALL element 233 in the OR gate 290, all of the input signals must be logically low to establish a conductive channel between the terminals 140 and 142. This connects the output to ground.

Thus, the ANY element 133 acts as a pull-down element in the CMOS OR gate 290, and all low inputs will produce a low output.

The device 30 is illustrated as having three inputs, which is ideally suited to the hexagonal device shape. However, it is within the scope of the invention to provide a gate device having one or two inputs. A device with one input can be used as a buffer or an inverter.

The device 30 can be configured without modification to operate as if it had one or two, rather than three inputs. For example, if it is desired to operate the NAND gate 260 of FIG. 3 with only two inputs, the gate terminal 158 can be connected to $V_{DD}$ and the two inputs applied to the gate terminals 154 and 156. The NOR gate of FIG. 5 can be adapted to provide a two input configuration by connecting the gate terminal 158 to ground and applying the two inputs to the gate terminals 154 and 156.

It is also within the scope of the invention to modify the device 30 to have only one or two inputs by physically omitting one or two of the gates 148, 150 and 152 and respective terminals 142,144,146 and 154,156,158.

Figure 7:
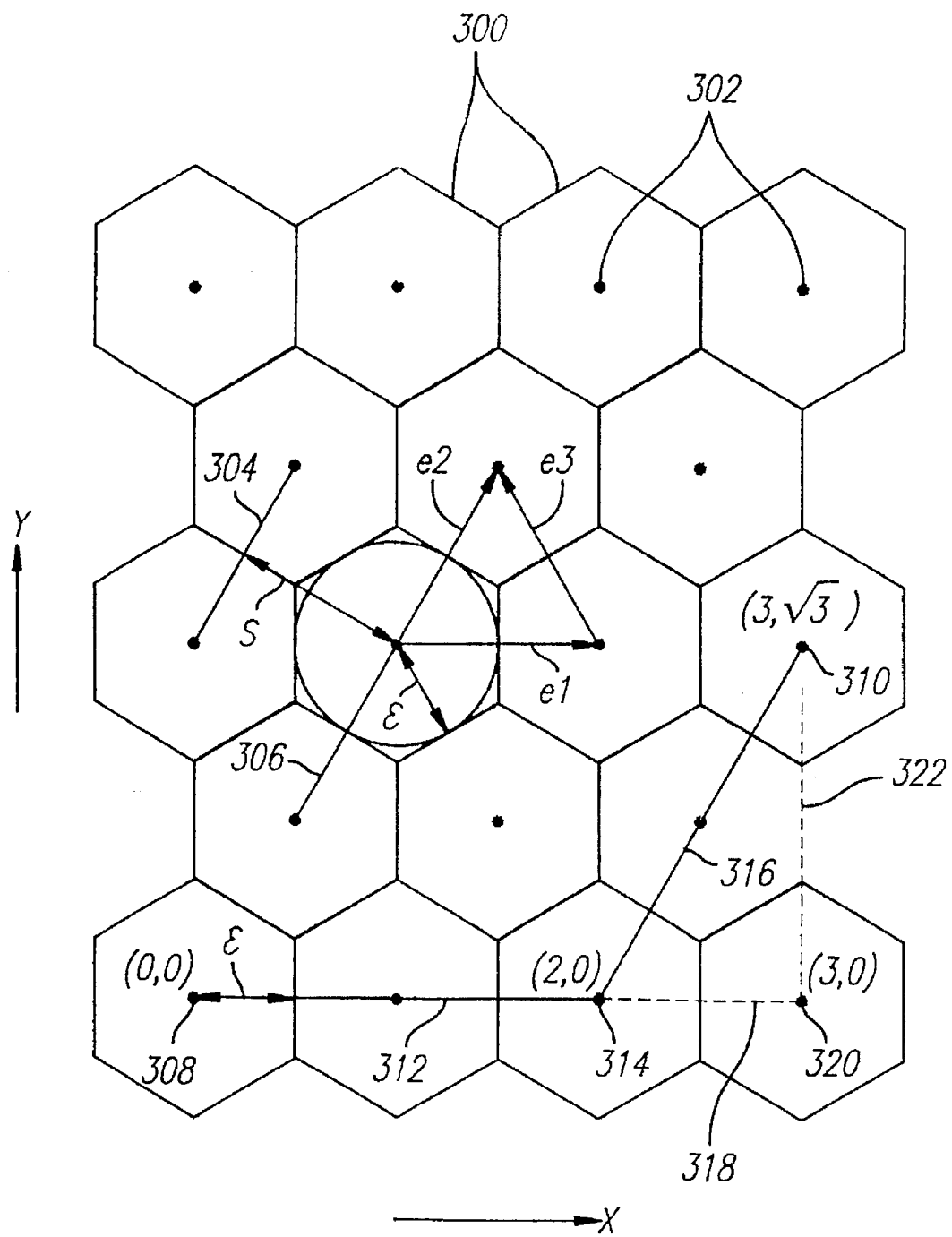
FIG. 7 is a diagram illustrating three direction routing for interconnecting the present devices based on hexagonal geometry in accordance with the present invention.

The geometry of a three directional hexagonal routing arrangement for interconnecting logic gates based on the present device 30 is illustrated in FIG. 7. An orthogonal coordinate system has an X axis and a Y axis. A closely packed pattern of small hexagons 300 is superimposed on the coordinate system, with the centers of the hexagons 300 being designated as terminal points 302.

For the purpose of the present disclosure, the term "closely packed" is construed to mean that the hexagons 300 are formed in a contiguous arrangement with adjacent hexagons 300 sharing common sides as illustrated, with no spaces being provided between adjacent hexagons 300. As will be described in detail below, logic gate devices based on the present device 30 are formed on the substrate 32 in a closely packed arrangement, with each logic gate device covering a number of the small hexagons 300.

In accordance with the invention, the centers of the hexagons 300 as indicated at 302 represent interconnect points for terminals of the logic gate devices. Electrical conductors for interconnecting the points 302 extend in three directions that make angles of 60° relative to each other.

The conductors that extend in the three directions can be formed in three different layers, or alternatively the conductors that extend in two or three of the directions can be formed in a single layer as long as they do not cross.

As illustrated, a direction $e_1$ extends parallel to the X axis. A direction $e_2$ is rotated 60 degrees counterclockwise from the direction $e_1$, whereas a direction $e_3$ is rotated 120 degrees counterclockwise from the direction $e_1$. If the directions $e_1$, $e_2$ and $e_3$ are represented by vectors having a common length as illustrated in FIG. 7, they form an equilateral triangle. For convenience, the notation $e_1$, $e_2$ and $e_3$ is used to denote the vectors that extend in the respective routing directions as well as the directions themselves. The radius of the circles that are inscribed by the hexagons 300 is designated as $\epsilon$.

The vectors $e_1$, $e_2$ and $e_3$ can be defined using the following notation.

$$e_1 = (1,0), e_2 = [(1/2),(\sqrt{3}/2)], e_3 = e_1 - e_2.$$

The geometric structure of the present invention can also be defined using set theory. A set SIX($\alpha,\epsilon$) of regular hexagons have centers at points $\alpha$, sides that are perpendicular to the vectors $e_1$, $e_2$ and $e_3$, and radii of inscribed circles equal to $\epsilon$ as described above. A set SU of points in a plane is denoted by $x_1 e_1 + x_2 e_2$, where $x_1$ and $x_2$ are integers.

The set SIX($\alpha,\frac{1}{2}$) for all $\alpha$ from the set SU intersect only on the edges of the hexagons and partition the plane into the closely packed arrangement as illustrated. Circles inscribed in these hexagons are also densely packed.

As further illustrated in FIG. 7, the perpendicular distance S between two adjacent conductors extending in the direction $e_2$, such as conductors 304 and 306, is equal to S= $\sqrt{3}/2$=0.87 measured in X-Y coordinates, or S=$\sqrt{3}\epsilon$=1.73$\epsilon$. The perpendicular distances between adjacent conductors extending in the other two directions $e_1$ and $e_2$ is the same as for the direction $e_2$.

An advantage of the present hexagonal routing arrangement is that the wirelength of conductors interconnecting two diagonally separated terminals is substantially less than with conventional rectilinear routing. As illustrated in FIG. 7, terminal points 308 and 310 to be interconnected are located at (x,y) coordinates (0,0) and (3,$\sqrt{3}$) respectively.

Using the present routing arrangement, the points 308 and 310 can be connected by a first conductor 312 extending in the direction $e_1$ from the point 310 to a point 314 at coordinates (2,0), and a second conductor 316 extending from the point 314 in the direction $e_2$ to the point 310. The length of each of the conductors 312 and 314 is 2, and the total connection length is 4.

Using the conventional rectilinear routing method, connection between the points 308 and 310 also requires the conductor 312 from the point 308 to the point 314. However, rather than the diagonal conductor 316, the conventional method requires two conductors, a conductor 318 from the point 314 to a point 320 at coordinates (3,0), and a conductor 322 from the point 320 to the point 310.

The combined length of the conductors 312 and 318 is 3, whereas the length of the conductor 322 is $\sqrt{3}$. The total length of the conventional rectilinear interconnect path is therefore 3+$\sqrt{3}$=4.73. The conventional path length between the points 308 and 310 is therefore 18.3% longer than the present path length.

The reduction of 18.3% in pathlength is approximately the average that is attained using the present hexagonal routing arrangement, although individual cases can vary from this value. However, the distance between any two points using rectilinear routing cannot be shorter than that using the present hexagonal routing in any case.

Figure 8:
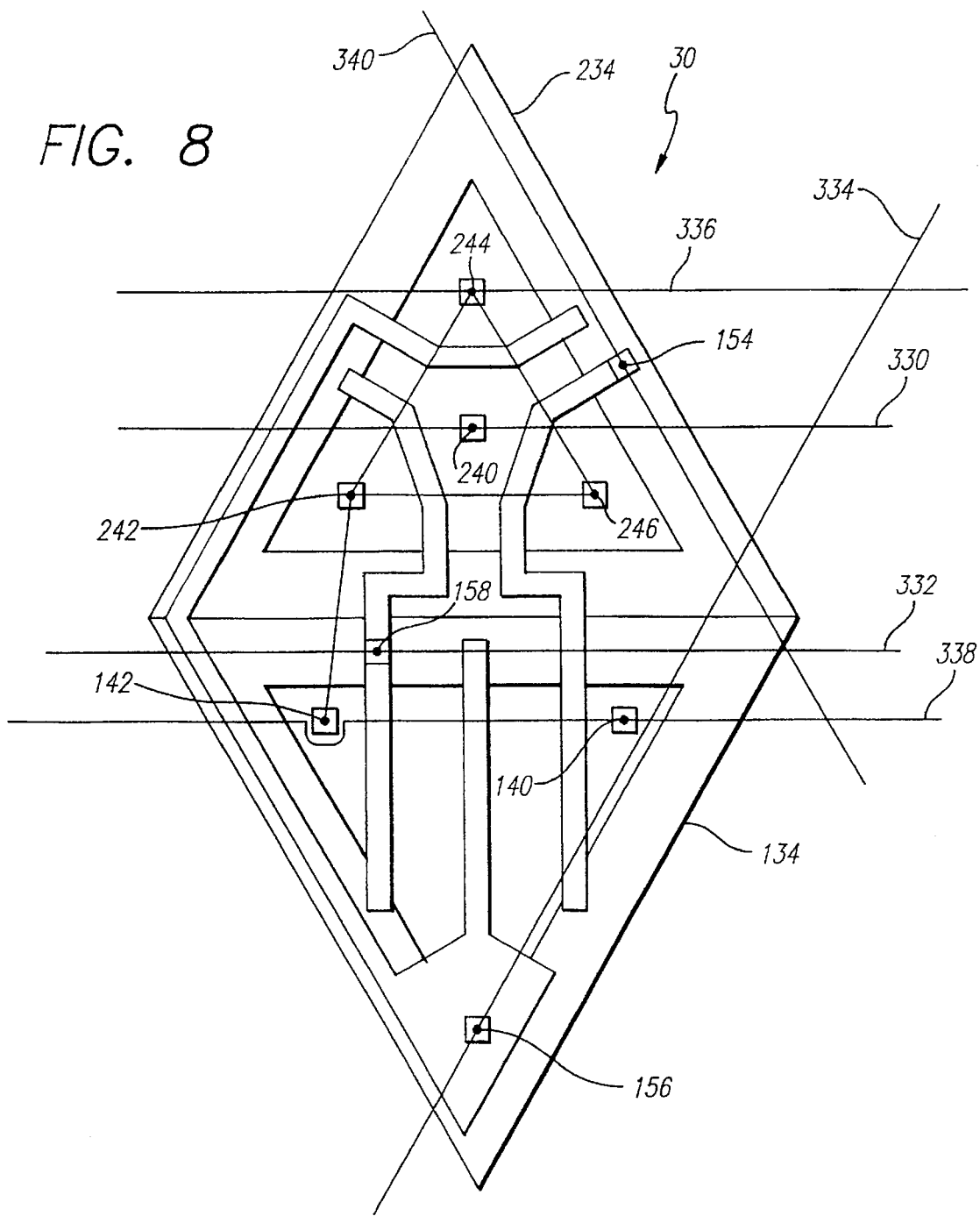
FIG. 8 is a diagram illustrating one device as connected using the three direction routing of FIG. 7.

An example of the device 30 as being interconnected using the hexagonal routing arrangement of FIG. 7 is illustrated in FIG. 8. It will be understood that the particular interconnect directions shown in the drawing are selected arbitrarily for illustrative purposes, and are not in any way limitative of the scope of the invention. In general, any of the wiring directions can be utilized to interconnect any of the elements of the device 30.

In the illustrated example, the terminals 242, 244, 246 and 142 are interconnected internally as illustrated in FIG. 3. Conductors 330, 336 and 338 which extend in the $e_1$ direction are provided for connection of the terminals 240, 244 and 140 respectively. Conductors 332, 334 and 340 which extend in the directions $e_1$, $e_2$ and $e_3$ are provided for connection of the terminals 158, 156 and 154 respectively. The conductors 332, 334 and 340, which carry the input signals, are preferably formed in different conductor layers.

Figure 9:
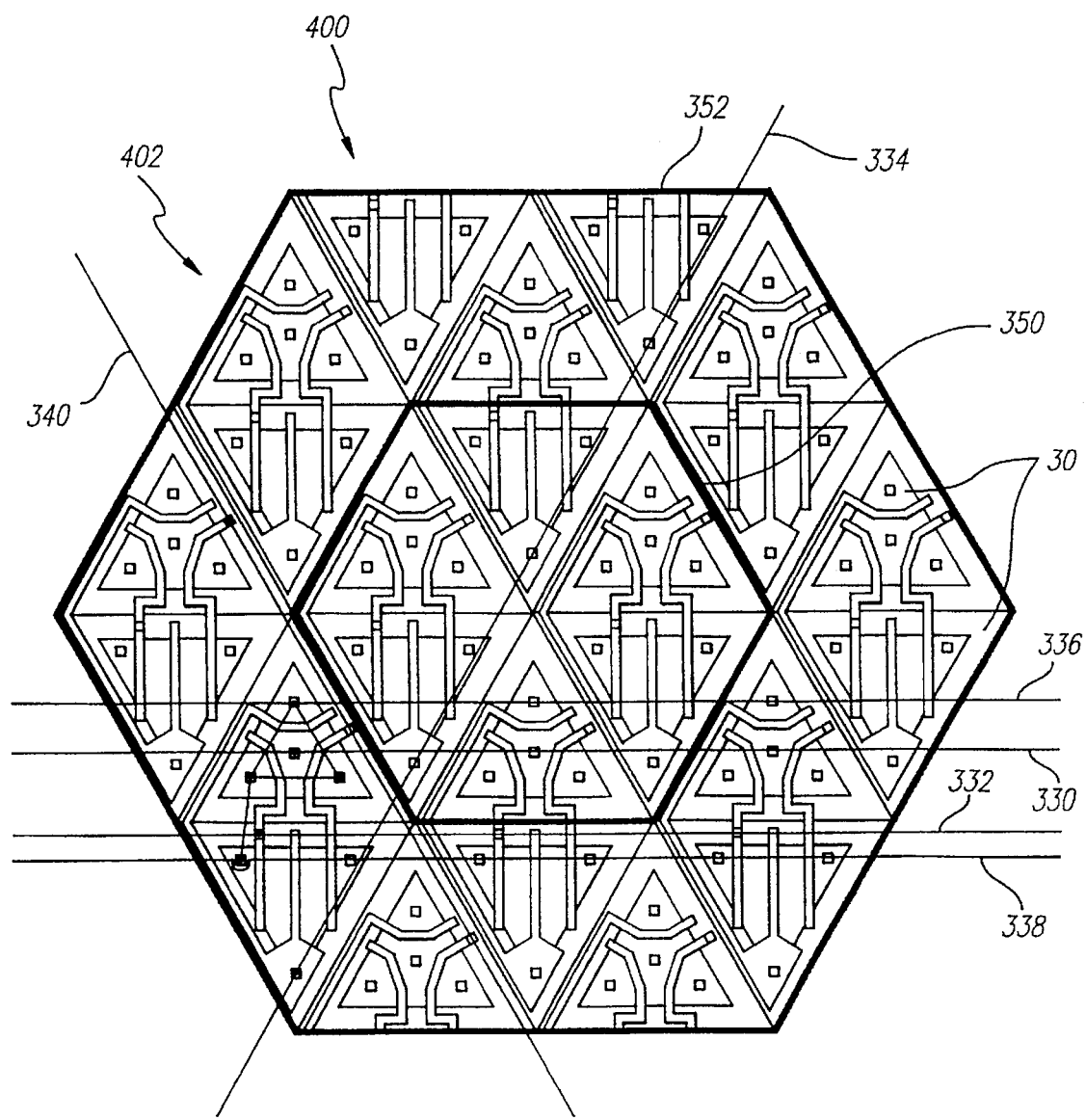
FIG. 9 is a diagram illustrating a microelectronic integrated circuit including a plurality of the present gate devices in a closely packed triangular arrangement.

FIG. 9 illustrates a microelectronic integrated circuit 400 according to the present invention comprising a semiconductor substrate 402 on which a plurality of the devices 30 are formed in a closely packed triangular arrangement. Further shown are a few illustrative examples of interconnection of the devices using the conductors 330 to 340 that extend in the three directions $e_1$, $e_2$ and $e_3$.

It will be noted that six closely packed elements 133 and 233 define a hexagonal shape having a periphery 350, and that 24 closely packed elements 133 and 233 define a larger hexagonal shape having a periphery 352. This relationship can be used within the scope of the invention to provide unit cells having hexagonal shapes defined by closely packed triangles, with internal structures similar to or different from that those which are explicitly described and illustrated.

It will be understood from the above description that the present gate device geometry and three direction interconnect arrangement substantially reduce the total wirelength interconnect congestion of the integrated circuit by providing three routing directions, rather than two as in the prior art. The routing directions include, relative to a first direction, two diagonal directions that provide Shorter interconnect paths than conventional rectilinear routing.

In addition, the number of conductors that extend parallel to each other is smaller, and the angles between conductors in different layers are larger than in the prior art, thereby reducing parasitic capacitance and other undesirable effects that result from conventional rectilinear routing.

It will be understood that the terms "source" and "drain" as applied to field effect transistors merely define opposite ends of a channel region which is controlled by a voltage applied to a gate. The source and drain are interchangeable in that current may flow into either one and out of the other.

Therefore, the terms "source" and "drain", and the relative polarities of voltages applied thereto, as used in the present specification, are arbitrary and reversible within the scope of the invention, and are not to be considered as limiting the invention to one or the other of the possible configurations of polarities.

Figure 10:
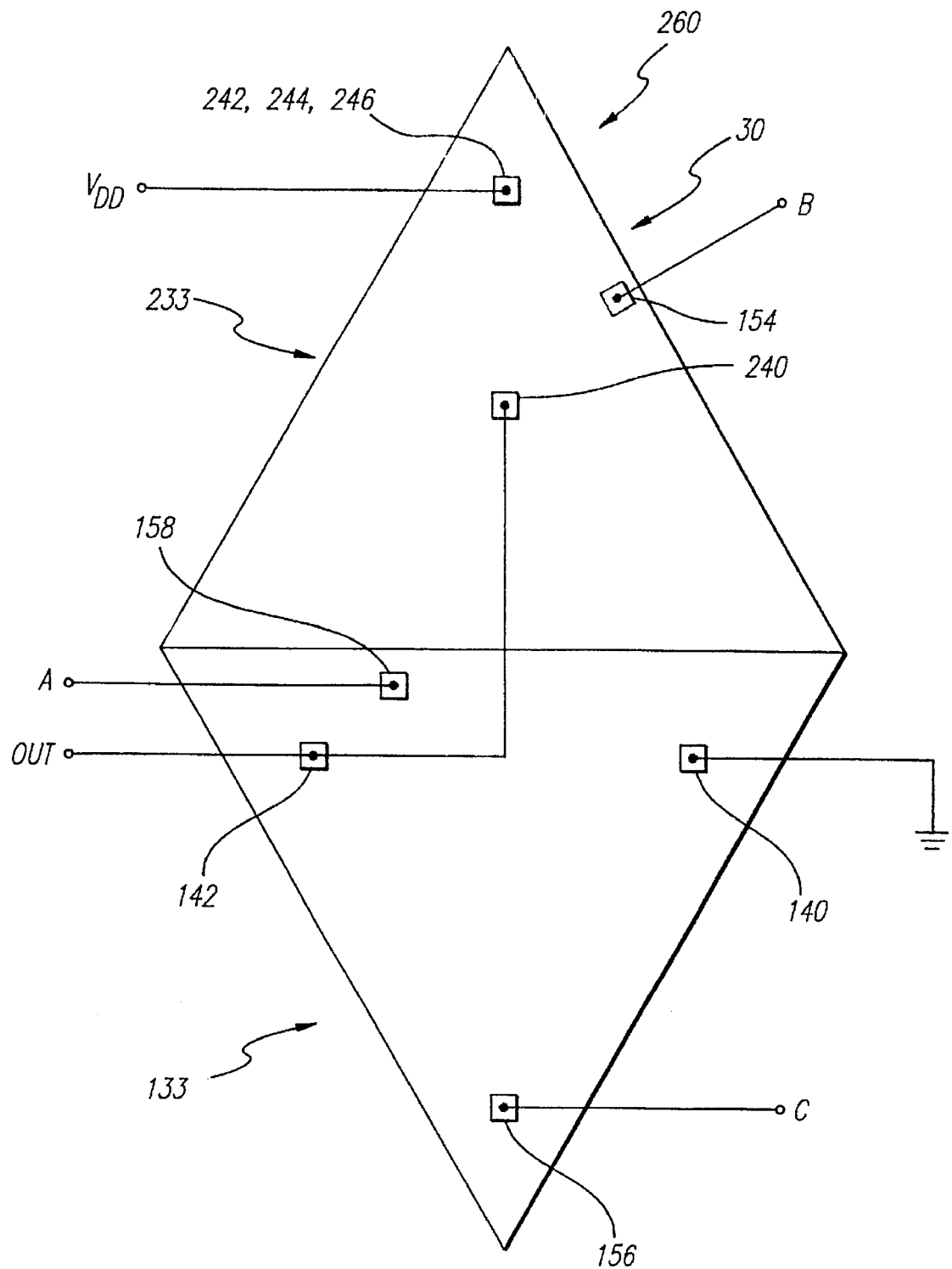
FIG. 10 is a diagram illustrating the gate device connected to provide a logical NAND function with reversed source and drain connections.

For example, FIG. 10 illustrates a modified CMOS NAND gate 260' based on a device 30' which differs from the NAND gate 260 of FIG. 3 in that the source and drain terminals of the ANY element 233 are reversed relative to each other.

In this embodiment of the invention, the terminals 242, 244 and 246 constitute sources and are connected to $V_{DD}$, whereas the center terminal 240 constitutes the drain and is connected to the output in parallel with the terminal 142 of the ALL element 133.

Although not explicitly illustrated, this modification is equally applicable to all other embodiments of the invention.

Figure 11:
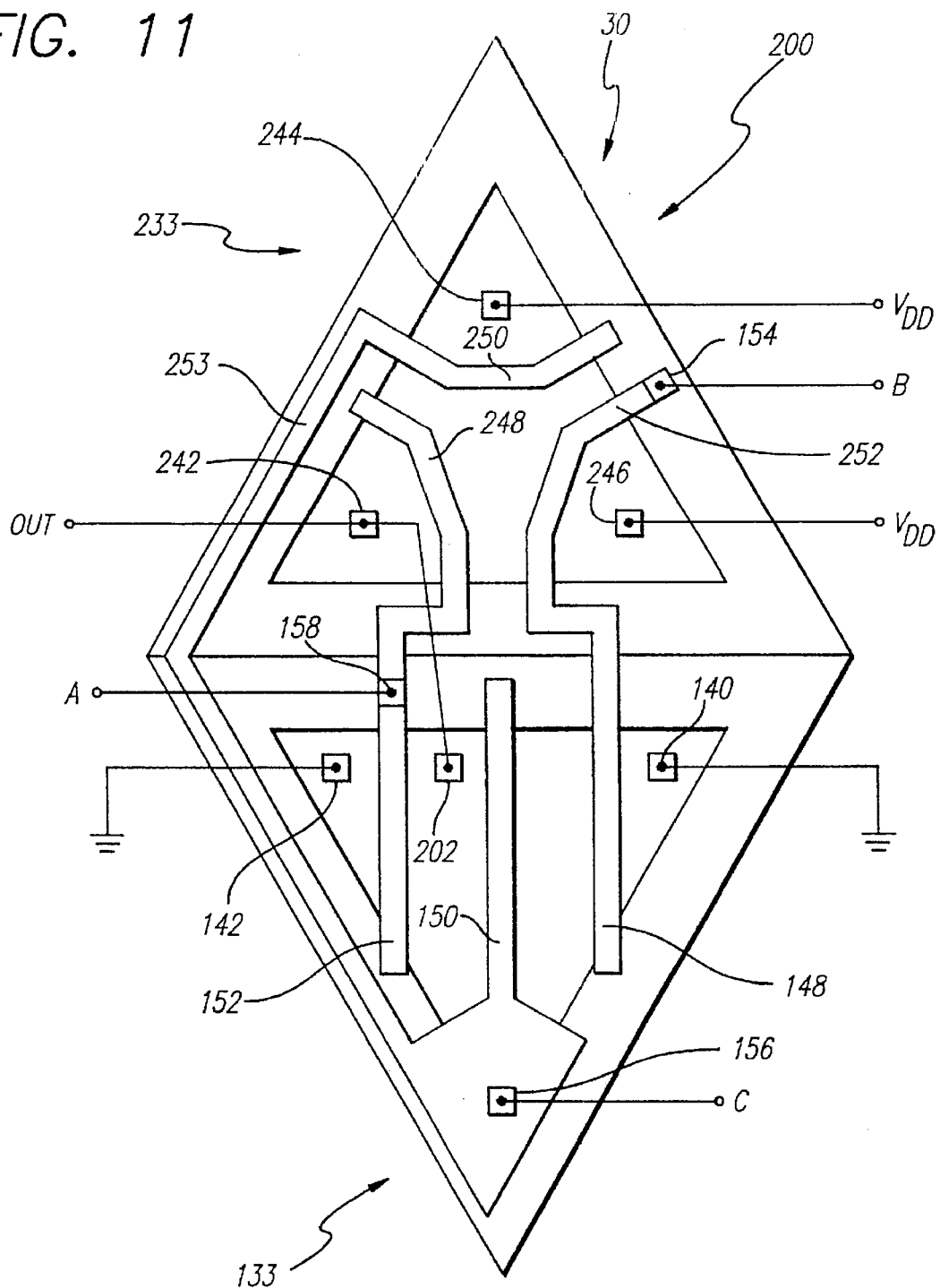
FIG. 11 is a diagram illustrating the gate device connected to provide a logical AND/OR function.

FIGS. 11 to 13 illustrate how the connections of the device 30 can be changed to provide a different logical function. In an AND/OR gate 200, the central terminal 240 of the ANY element 233 is not used, and can be physically omitted if desired. The ANY element 233 is PMOS, whereas the ALL element 133 is NMOS. The terminals 244 and 246 of the are connected to $V_{DD}$, and the output signal OUT appears at the terminal 242. The terminals 140 and 142 of the ALL element 133 are connected to ground. An additional terminal 202 is provided between the gates 150 and 152.

The gate 200 provides the logical function $\overline{A+(B \cdot C)}$. As illustrated in the equivalent circuit diagram of FIG. 12, the inputs B and C are applied to inverting inputs of an OR gate 204, the output of which is applied to a non-inverting input of an AND gate 206. The input A is applied to an inverting input of the AND gate 206, whereby the output of the AND gate 206 is $\overline{A+(B \cdot C)}$.

The ANY element 233 functions as the pull-up element of the gate 200. Since the gate 248 is in front of the terminal 242, a logically low signal A must be applied to the gate terminal 158 to enhance the channel under the gate 248 and connect the terminal 242 to either the gate 250 or the gate 252. This provides the functionality of the AND gate 206.

Since both terminals 244 and 246 are connected to $V_{DD}$, a logically low signal B or C applied to the gate terminal 154 or 156 will enhance the channel under the gate 250 and 252 respectively and establish a conductive path from $V_{DD}$ to the gate 248.

Thus, the output OUT will be pulled high if the input A and either of the inputs B and C are low. If the input A or either of the inputs B and C is high, no conductive path will be established between $V_{DD}$ and the output at the terminal 242, and the terminal 242 will float.

The ALL element 133 functions as the pull-down element of the gate 200. Since the gate 152 is disposed between the grounded terminal 142 and the terminal 202 which is connected to the output, a high signal A applied to the gate 152 will enhance the channel under the gate 152 and connect the output terminal 202 to the terminal 142 and thereby to ground. This provides the functionality of the AND gate 206.

Since both gates 148 and 150 are disposed between the terminal 140 and the terminal 202, high signals B and C must be applied to both gates 148 and 150 to connect the terminal 202 to the terminal 140 and thereby to ground. This provides the functionality of the OR gate 204.

Thus, the output OUT will be pulled low if the input A and/or both inputs B and C are high, and the terminal 202 will float if the input A and either of the inputs B and C are low.

FIG. 13 illustrates the gate 200 as represented by equivalent field-effect transistors. PMOS transistors 208, 210 and 212 represent the portions of the gate 200 corresponding to functionality provided by the gates 252, 250 and 248 and respectively. NMOS transistors 214, 216 and 218 represent the portions of the gate 200 corresponding to functionality provided by the gates 152, 148 and 150 respectively.

Various modifications will become possible for those skilled in the art after receiving the teachings of the present disclosure without departing from the scope thereof.

I claim:

1. A CMOS microelectronic device formed on a semiconductor substrate, comprising:

a triangular ANY element of a first conductivity type, having a first input and an output; and a triangular ALL element of a second conductivity type which is opposite to said first conductivity type, having a first input and an output;

in which said first inputs of the ANY and ALL elements are electrically interconnected, and said outputs of the ANY and ALL elements are electrically interconnected.

2. A device as in claim 1, in which:

the ANY element has a periphery defined by a triangle including three edges;

the ALL element has a periphery defined by a triangle including three edges; and one of said three edges of the ANY element is common with one of said three edges of the ALL element.

3. A device as in claim 1, in which the ANY element has a periphery defined by a triangle, and comprises:

an active area formed within said periphery;

a central terminal formed in a central portion of said active area;

a first terminal which is formed in said active area and spaced from the central terminal; and a first gate which is formed between the first terminal and the central terminal and is electrically connected to said first input of the ANY element.

4. A device as in claim 3, in which the ANY element further comprises an inactive area disposed between said active area and said periphery.

5. A device as in claim 4, in which the ANY element further comprises a first gate terminal which is formed in said inactive area, and is connected to the first gate and said first input of the ANY element.

6. A device as in claim 3, in which:

the central terminal constitutes a source terminal; and the first terminal constitutes a drain terminal.

7. A device as in claim 3, in which:

the central terminal constitutes a drain terminal; and the first terminal constitutes a source terminal.

8. A device as in claim 3, in which:

the central terminal is connected to said output of the ANY element; and the first terminal is connected to a predetermined electrical potential.

9. A device as in claim 3, in which:

the first terminal is connected to said output of the ANY element; and the central terminal is connected to a predetermined electrical potential.

10. A device as in claim 3, in which:

said triangle has first, second and third vertices;

the first terminal is formed adjacent to said first vertex; and the ANY element further comprises:

a second terminal formed adjacent to said second vertex in said active area; and a second gate which is formed between the second terminal and the central terminal and is connected to a second input of the ANY element.

11. A device as in claim 10, in which the ANY element further comprises:

a third terminal formed adjacent to said third vertex in said active area; and a third gate which is formed between the third terminal and the central terminal and is connected to a third input of the ANY element.

12. A device as in claim 3, in which:

the ANY element further comprises an inactive area disposed between said active area and said periphery; and the first gate has opposite end portions that extend into said inactive area.

13. A device as in claim 1, in which the ALL element has a periphery defined by a triangle and comprises:

an active area formed within said periphery;

a first terminal formed in said active area;

a second terminal which is formed in said active area and spaced from the first terminal; and a first gate which is formed between the first terminal and the second terminal and is connected to said first input of the ALL element.

14. A device as in claim 13, in which the ALL element further comprises an inactive area disposed between said active area and said periphery.

15. A device as in claim 13, in which the ALL element further comprises a first gate terminal which is formed in said inactive area and is connected to the first gate and to said first input of the ALL element.

16. A device as in claim 13, in which:

said triangle has first, second and third vertices; and the first and second terminals are formed adjacent to said first and second vertices respectively.

17. A device as in claim 13, in which:

the first terminal is connected to said output of the ALL element; and the second terminal is connected to a predetermined electrical potential.

18. A device as in claim 13, in which the ALL element further comprises a second gate which is formed between the first gate and the second terminal and is connected to a second input of the ALL element.

19. A device as in claim 18, in which the ALL element further comprises a third gate which is formed between the second gate and the second terminal and is connected to a third input of the ALL element.

20. A device as in claim 13, in which:

the ALL element further comprises an inactive area disposed between said active area and said periphery; and the first gate has opposite end portions that extend into said inactive area.

21. A device as in claim 1, in which:

the ANY element further comprises:

a central terminal;

a first terminal which is spaced from the central terminal;

a first gate which is formed between the first terminal and the central terminal and is electrically connected to said first input of the ANY element;

a second terminal which is spaced from the central terminal and the first terminal; and a second gate which is formed between the second terminal and the central terminal and is connected to a second input of the ANY element; and the ALL element further comprises:

a first terminal;

a second terminal which is spaced from the first terminal;

a first gate which is formed between the first terminal and the second terminal and is connected to said first input of the ALL element; and a second gate which is formed between the first gate and the second terminal and is electrically connected to a second input of the ALL element and to said second input of the ANY element.

22. A device as in claim 21, in which:

said first conductivity type is P-type;

the central terminal of the ANY element constitutes a source terminal and is connected to a first electrical potential;

the first and second terminals of the ANY element constitute drain terminals and are connected to said output of the ANY element;

said second conductivity type is N-type;

the first terminal of the ALL element constitutes a source terminal and is connected to a second electrical potential which is lower than said first electrical potential;

the second terminal of the ALL element constitutes a drain terminal and is connected to said output of the ALL element; and the device provides a NAND function.

23. A device as in claim 21, in which:

said first conductivity type is P-type;

the central terminal of the ANY element constitutes a source terminal and is connected to said output of the ANY element;

the first and second terminals of the ANY element constitute drain terminals and are connected to a first electrical potential;

said second conductivity type is N-type;

the first terminal of the ALL element constitutes a source terminal and is connected to said output of the ALL element;

the second terminal of the ALL element constitutes a drain terminal and is connected to a second electrical potential which is higher than said first electrical potential; and the device provides an AND function.

24. A device as in claim 21, in which:

said first conductivity type is N-type;

the central terminal of the ANY element constitutes a source terminal and is connected to a first electrical potential;

the first and second terminals of the ANY element constitute drain terminals and are connected to said output of the ANY element;

said second conductivity type is P-type;

the first terminal of the ALL element constitutes a source terminal and is connected to a second electrical potential which is higher than said first electrical potential;

the second terminal of the ALL element constitutes a drain terminal and is connected to said output of the ALL element; and the device provides a NOR function.

25. A device as in claim 21, in which:

said first conductivity type is N-type;

the central terminal of the ANY element constitutes a source terminal and is connected to said output of the ANY element;

the first and second terminals of the ANY element constitute drain terminals and are connected to a first electrical potential;

said second conductivity type is P-type;

the first terminal of the ALL element constitutes a source terminal and is connected to said output of the ALL element;

the second terminal of the ALL element constitutes a drain terminal and is connected to a second electrical potential which is lower than said first electrical potential; and the device provides an OR function.

26. A microelectronic integrated circuit, comprising:

a semiconductor substrate; and a plurality of CMOS microelectronic devices formed on the substrate, each device including:

a triangular ANY element of a first conductivity type, having a first input and an output; and a triangular ALL element of a second conductivity type which is opposite to said first conductivity type, having a first input and an output;

in which said first inputs of the ANY and ALL elements are electrically interconnected, and said outputs of the ANY and ALL elements are electrically interconnected respectively.

27. An integrated circuit as in claim 26, in which:

each ANY element has a periphery defined by a triangle including three edges;

each ALL element has a periphery defined by a triangle including three edges; and one of said three edges of each ANY element is common with one of said three edges of each ALL element respectively.

28. An integrated circuit as in claim 26, in which at least one of said ANY elements has a periphery defined by a triangle, and comprises:

an active area formed within said periphery;

a central terminal formed in a central portion of said active area;

a first terminal which is formed in said active area and spaced from the central terminal; and a first gate which is formed between the first terminal and the central terminal and is electrically connected to said first input of said at least one of said ALL elements.

29. An integrated circuit as in claim 28, in which said at least one of said ANY elements further comprises an inactive area disposed between said active area and said periphery.

30. An integrated circuit as in claim 29, in which said at least one of said ANY elements further comprises a first gate terminal which is formed in said inactive area, and is connected to the first gate and said first input of said at least one of said ANY elements.

31. An integrated circuit as in claim 28, in which:

the central terminal constitutes a source terminal; and the first terminal constitutes a drain terminal.

32. An integrated circuit as in claim 28, in which:

the central terminal constitutes a drain terminal; and the first terminal constitutes a source terminal.

33. An integrated circuit as in claim 28, in which:

the central terminal is connected to said output of the ANY element; and the first terminal is connected to a predetermined electrical potential.

34. An integrated circuit as in claim 28, in which:

the first terminal is connected to said output of the ANY element; and the central terminal is connected to a predetermined electrical potential.

35. An integrated circuit as in claim 28, in which:

said triangle has first, second and third vertices;

the first terminal is formed adjacent to said first vertex; and said at least one of said ANY elements further comprises:

a second terminal formed adjacent to said second vertex in said active area; and a second gate which is formed between the second terminal and the central terminal and is connected to a second input of said at least one of said ANY elements.

36. An integrated circuit as in claim 35, in which said at least one of said ANY elements further comprises:

a third terminal formed adjacent to said third vertex in said active area; and a third gate which is formed between the third terminal and the central terminal and is connected to a third input of said at least one of said ANY elements.

37. An integrated circuit as in claim 28, in which:

said at least one of said ANY elements further comprises an inactive area disposed between said active area and said periphery; and the first gate has opposite end portions that extend into said inactive area.

38. An integrated circuit as in claim 26, in which at least one of said ALL elements has a periphery defined by a triangle and comprises:

an active area formed within said periphery;

a first terminal formed in said active area;

a second terminal which is formed in said active area and spaced from the first terminal; and a first gate which is formed between the first terminal and the second terminal and is connected to said first input of said at least one of said ALL elements.

39. An integrated circuit as in claim 38, in which said at least one of said ALL elements further comprises an inactive area disposed between said active area and said periphery.

40. An integrated circuit as in claim 38, in which said at least one of said ALL elements further comprises a first gate terminal which is formed in said inactive area and is connected to the first gate and to said first input of said at least one of said ALL elements.

41. An integrated circuit as in claim 38, in which:

said triangle has first, second and third vertices; and the first and second terminals are formed adjacent to said first and second vertices respectively.

42. An integrated circuit as in claim 38, in which:

the first terminal is connected to said output of the ALL element; and the second terminal is connected to a predetermined electrical potential.

43. An integrated circuit as in claim 38, in which said at least one of said ALL elements further comprises a second gate which is formed between the first gate and the second terminal and is connected to a second input of said at least one of said ALL elements.

44. An integrated circuit as in claim 43, in which said at least one of said ALL elements further comprises a third gate which is formed between the second gate and the second terminal and is connected to a third input of said at least one of said ALL elements.

45. An integrated circuit as in claim 38, in which:

said at least one of said ALL elements further comprises an inactive area disposed between said active area and said periphery; and the first gate has opposite end portions that extend into said inactive area.

46. An integrated circuit as in claim 26, in which:

at least one of said devices comprises an ANY element which further comprises:

a central terminal;

a first terminal which is spaced from the central terminal;

a first gate which is formed between the first terminal and the central terminal and is electrically connected to said first input of the ANY element;

a second terminal which is spaced from the central terminal and the first terminal; and a second gate which is formed between the second terminal and the central terminal and is connected to a second input of the ANY element; and said at least one of said devices comprises an ALL element which further comprises:

a first terminal;

a second terminal which is spaced from the first terminal;

a first gate which is formed between the first terminal and the second terminal and is connected to said first input of the ALL element; and a second gate which is formed between the first gate and the second terminal and is electrically connected to a second input of the ALL element and to said second input of the ANY element.

47. An integrated circuit as in claim 26, in which:

the devices are closely packed on the substrate; and the circuit further comprises interconnect wiring for electrically interconnecting the devices in a predetermined manner, the wiring comprising electrical conductors which extend in directions that are angularly displaced from each other by substantially 60°.

* * * * *